United States Patent
Li et al.

(10) Patent No.: US 8,107,565 B2
(45) Date of Patent: Jan. 31, 2012

(54) AUTOMATIC GAIN CONTROL (AGC) FOR OFDM-BASED TRANSMISSION IN A WIRELESS COMMUNICATION NETWORK

(75) Inventors: Junyi Li, Chester, NJ (US); Vladimir Parizhsky, New York, NY (US); Frank A. Lane, Asbury, NJ (US); Aleksandar Jovicic, Piscataway, NJ (US); Ying Wang, Easton, PA (US)

(73) Assignee: QUALCOMM Incorporated, San Diego, CA (US)

( * ) Notice: Subject to any disclaimer, the term of this patent is extended or adjusted under 35 U.S.C. 154(b) by 553 days.

(21) Appl. No.: 12/360,907

(22) Filed: Jan. 28, 2009

(65) Prior Publication Data

US 2010/0189188 A1 Jul. 29, 2010

(51) Int. Cl.
 *H04L 27/08* (2006.01)
(52) U.S. Cl. .......................... 375/345; 375/260
(58) Field of Classification Search .................. 375/260, 375/345; 370/208–210
 See application file for complete search history.

(56) References Cited

U.S. PATENT DOCUMENTS

| | | | | |
|---|---|---|---|---|
| 6,999,508 | B1 * | 2/2006 | Redfern | 375/229 |
| 2007/0002724 | A1 * | 1/2007 | Khan | 370/203 |
| 2008/0002792 | A1 | 1/2008 | Shalev | |
| 2008/0273636 | A1 | 11/2008 | Zhu et al. | |

FOREIGN PATENT DOCUMENTS

WO WO2009152394 12/2009

OTHER PUBLICATIONS

International Search Report & Written Opinion—PCT/US2010/022290—International Search Authority—European Patent Office—May 25, 2010.
IEEE Std 802.11a-1999, Part 11: Wireless LAN Medium Access Control (MAC) and Physical Layer in the 5 Ghz Band, Sep. 16, 1999, IEE-SA Standards Board, New York, NY.

* cited by examiner

*Primary Examiner* — Emmanuel Bayard
(74) *Attorney, Agent, or Firm* — James K. O'Hare

(57) ABSTRACT

Techniques for performing automatic gain control (AGC) at a receiver are described. The receiver may receive an OFDM-based symbol composed of a cyclic prefix and a useful portion. The receiver may scale the OFDM-based symbol with an initial receiver gain, adjust the initial receiver gain based on the cyclic prefix, apply the adjusted receiver gain prior to the useful portion, and process the useful portion to recover at least one signal sent by at least one transmitter. The receiver may select the initial receiver gain, e.g., based on a predicted received power level for the at least one transmitter, a pattern of different receiver gains, etc. The receiver may apply the initial receiver gain at the start of the OFDM-based symbol. The receiver may measure the power of a set of samples in the cyclic prefix and may adjust the receiver gain based on the measured power and a target power.

30 Claims, 11 Drawing Sheets

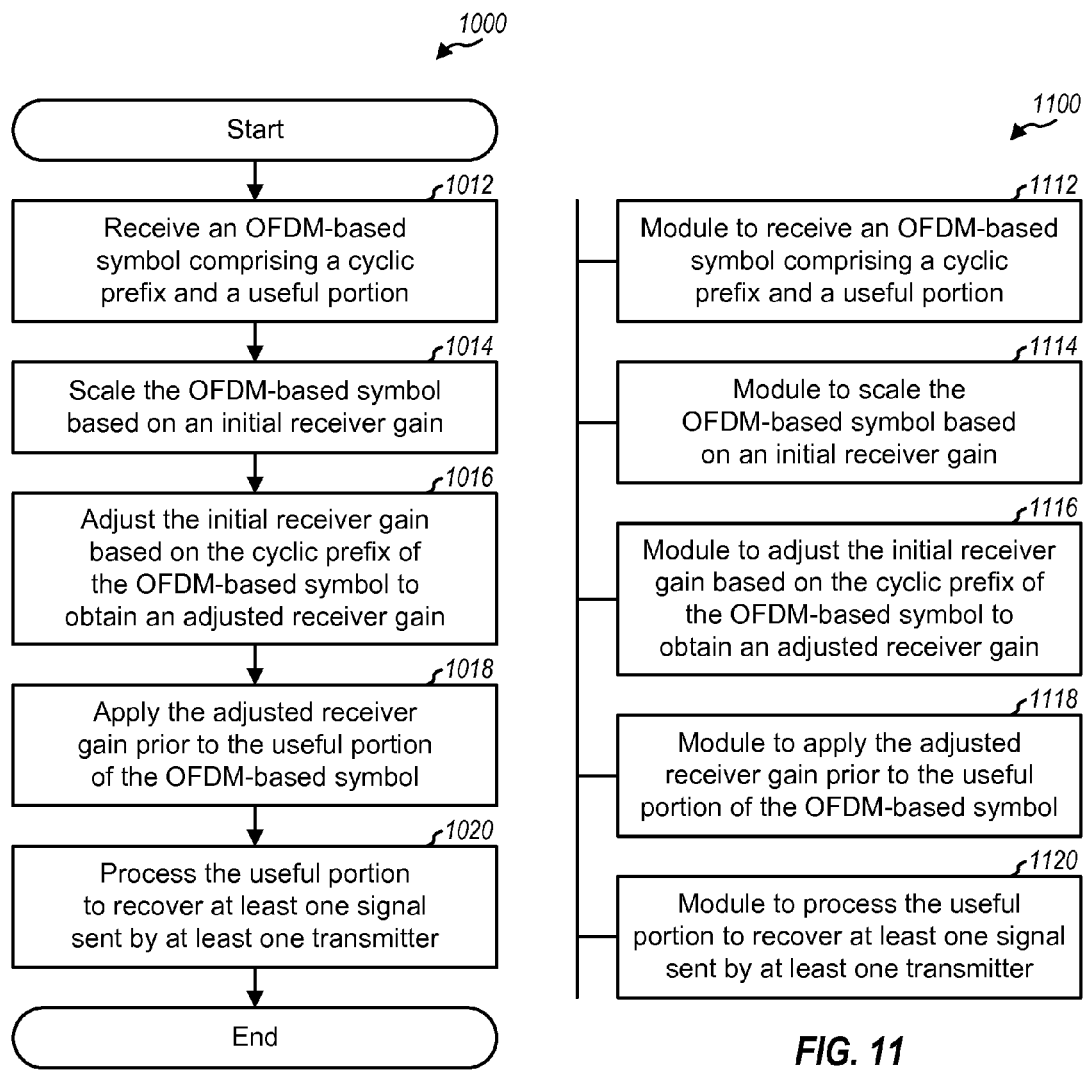

AUTOMATIC GAIN CONTROL (AGC) FOR OFDM-BASED TRANSMISSION IN A WIRELESS COMMUNICATION NETWORK

BACKGROUND

I. Field

The present disclosure relates generally to communication, and more specifically to techniques for performing automatic gain control (AGC) at a receiver in a wireless communication network.

II. Background

Wireless communication networks are widely deployed to provide various communication services such as voice, video, packet data, messaging, broadcast, etc. These wireless networks may be capable of supporting communication for multiple users by sharing the available network resources. Examples of such wireless networks include wireless wide area networks (WWANs), wireless metropolitan area networks (WMANs), and wireless local area networks (WLANs).

In a wireless communication network, a receiver (e.g., a terminal) may receive signals from transmitters, which may be base stations and/or other terminals. The transmitters may transmit their signals at the same or different power levels. Furthermore, the transmitters may be located at different distances to the receiver and may thus have different pathloss to the receiver. The receiver may receive the signals from different transmitters at different received power levels. The receiver may perform AGC and adjust its gain so that (i) strong signals are attenuated to avoid clipping of an analog-to-digital converter (ADC) at the receiver and (ii) weak signals are amplified to occupy the full ADC range. By using the proper receiver gain, clipping of the ADC and degradation due to ADC clipping may both be avoided. It is thus desirable to effectively perform AGC at the receiver.

SUMMARY

Techniques for performing AGC based on a cyclic prefix of an orthogonal frequency division multiplexing (OFDM) symbol or a single-carrier frequency division multiplexing (SC-FDM) symbol are described herein. In one design, a receiver may receive an OFDM-based symbol (e.g., an OFDM symbol or an SC-FDM symbol) comprising a cyclic prefix and a useful portion. The receiver may scale (e.g., amplify or attenuate) the OFDM-based symbol based on an initial receiver gain, adjust the initial receiver gain based on the cyclic prefix of the OFDM-based symbol, and apply the adjusted receiver gain prior to the useful portion of the OFDM-based symbol. The receiver may then process the useful portion to recover at least one signal sent by at least one transmitter.

The receiver may select the initial receiver gain and apply this initial receiver gain at the start of the OFDM-based symbol. In one design, the receiver may identify one or more transmitters expected to transmit in the OFDM-based symbol and may determine the initial receiver gain based on a predicted received power level for the identified transmitter(s). In another design, the receiver may select the initial receiver gain by cycling through a pattern of different receiver gains. In yet another design, the receiver may set the initial receiver gain to a predetermined value. In any case, by selecting an appropriate initial receiver gain, the amount of adjustment for the receiver gain may be reduced.

The receiver may adjust the receiver gain in various manners. In one design, the receiver may measure the power of a set of samples in the cyclic prefix of the OFDM-based symbol and may adjust the receiver gain based on the measured power and a target power. In another design, the receiver may count the number of samples with power exceeding a threshold among the set of samples and may adjust the receiver gain based on the number of samples with power exceeding the threshold.

The receiver may receive one or more additional OFDM-based symbols. In one design, the receiver may perform AGC independently for each OFDM-based symbol if a different set of transmitters can transmit in each OFDM-based symbol. In another design, the receiver may update the receiver gain across the OFDM-based symbols if the same set of transmitters transmits in these OFDM-based symbols.

Various aspects and features of the disclosure are described in further detail below.

BRIEF DESCRIPTION OF THE DRAWINGS

FIG. 10 shows a process for performing AGC.

FIG. 11 shows an apparatus for performing AGC.

DETAILED DESCRIPTION

The AGC techniques described herein may be used for various wireless communication networks such as WWANs, WMANs, WLANs, etc. The terms "network" and "system" are often used interchangeably. A WWAN may be a Code Division Multiple Access (CDMA) network, a Time Division Multiple Access (TDMA) network, a Frequency Division Multiple Access (FDMA) network, an Orthogonal FDMA (OFDMA) network, a Single-Carrier FDMA (SC-FDMA) network, etc. A CDMA network may implement a radio technology such as Universal Terrestrial Radio Access (UTRA), cdma2000, etc. A TDMA network may implement a radio technology such as Global System for Mobile Communications (GSM). An OFDMA network may implement a radio technology such as Evolved UTRA (E-UTRA), Ultra Mobile Broadband (UMB), Flash-OFDM®, etc. Long Term Evolution (LTE) is an upcoming release of "3rd Generation Partnership Project" (3GPP) that uses E-UTRA, which employs OFDMA on the downlink and SC-FDMA on the uplink. A WLAN may implement one or more standards in the IEEE 802.11 family of standards (which is also referred to as Wi-Fi), Hiperlan, etc. A WMAN may implement one or more standards in the IEEE 802.16 family of standards (which is also referred to as WiMAX). The techniques described herein may be used for the wireless networks and radio technologies mentioned above as well as other wireless networks and radio technologies.

Figure 1:
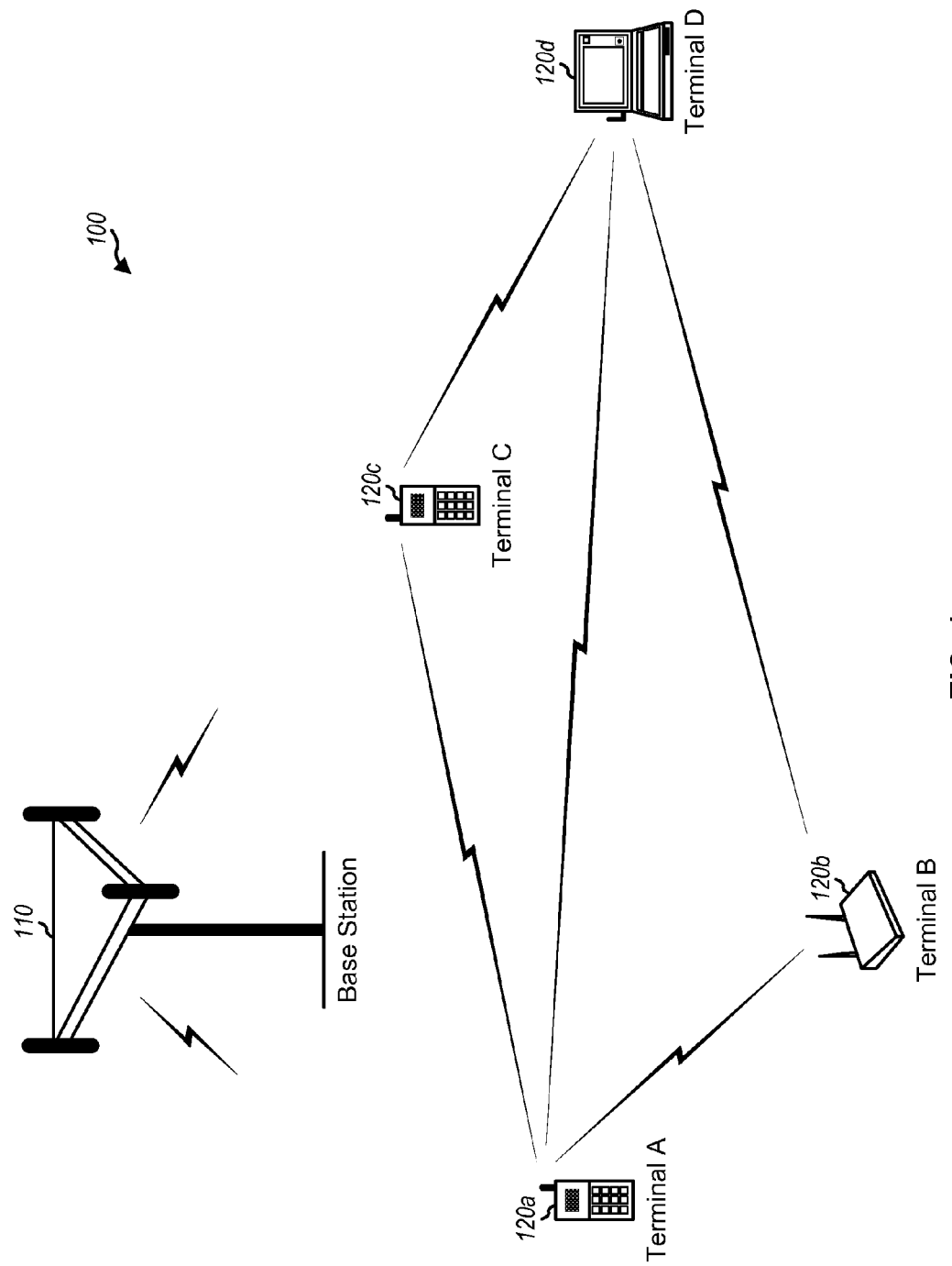
FIG. 1 shows a wireless communication network.

FIG. 1 shows a wireless communication network 100, which may include a number of base stations and a number of terminals. For simplicity, only one base station 110 and four terminals 120a, 120b, 120c and 120d are shown in FIG. 1. A base station may be a fixed station that communicates with the terminals and may also be referred to as an access point, a Node B, an evolved Node B (eNB), etc. Terminals 120 may be dispersed throughout the network, and each terminal may be stationary or mobile. A terminal may also be referred to as an access terminal, a mobile station, a user equipment (UE), a subscriber unit, a station, etc. A terminal may be a cellular phone, a personal digital assistant (PDA), a wireless modem, a wireless communication device, a handheld device, a laptop computer, a cordless phone, a wireless local loop (WLL) station, etc. A terminal may communicate with a base station or may receive information (e.g., timing information) from the base station. Alternatively or additionally, a terminal may communicate peer-to-peer with other terminals.

Figure 2:
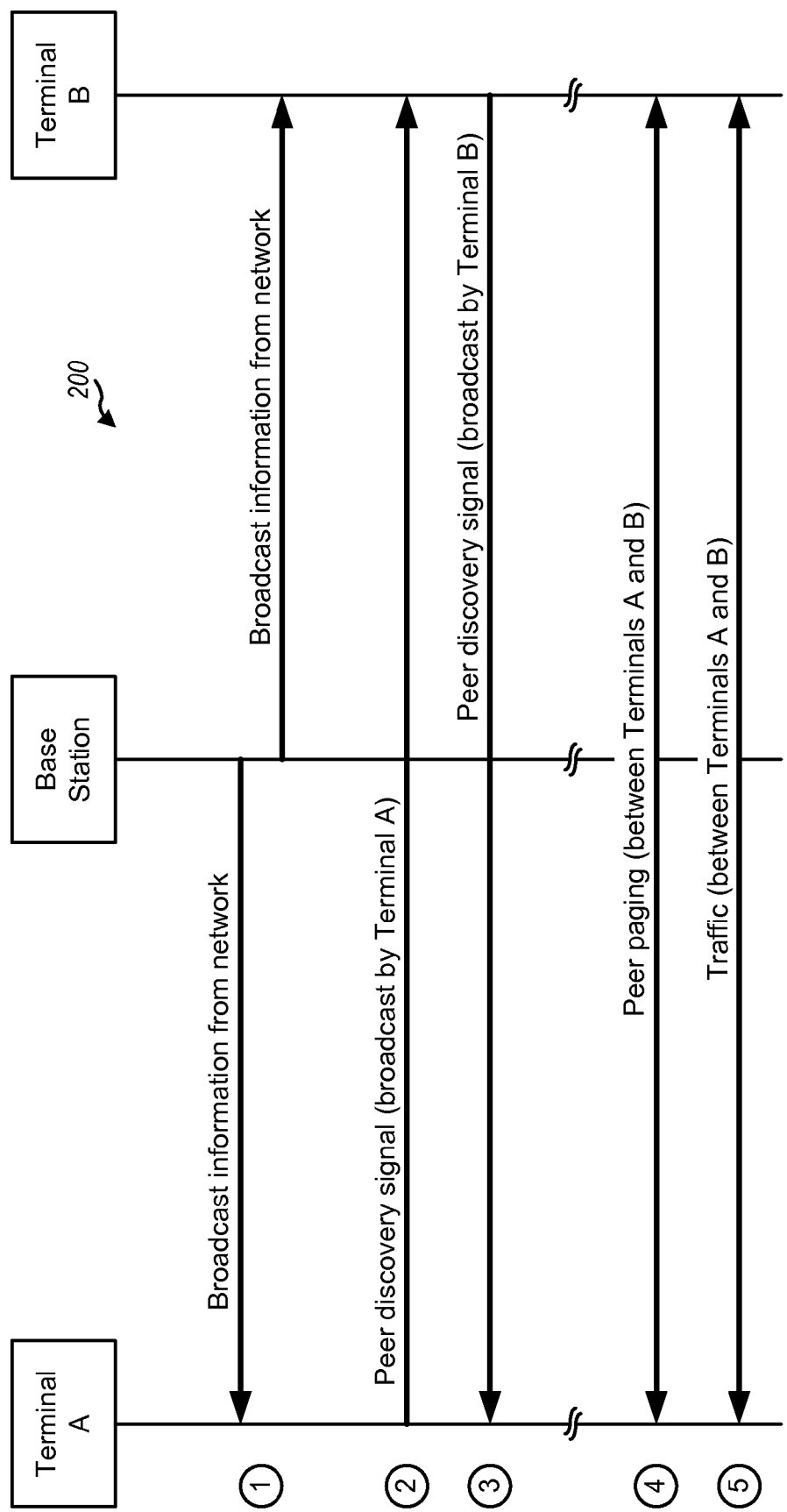
FIG. 2 shows a message flow for peer-to-peer communication.

FIG. 2 shows a design of a message flow 200 that may be used for peer-to-peer communication between two terminals A and B in wireless network 100. Initially (e.g., at power up), terminals A and B may each receive broadcast information from base station 110 (step 1). Each terminal may obtain timing and possibly other information from the broadcast information. Terminal A may periodically broadcast a peer discovery signal to allow other terminals within the vicinity to detect terminal A (step 2). Similarly, terminal B may periodically broadcast a peer discovery signal to allow other terminals within the vicinity to detect terminal B (step 3). Terminals A and B may detect the presence of one another via the peer discovery signals. Thereafter, terminals A and B may page one another whenever there is data to send (step 4). A connection may then be established, and terminals A and B may exchange signaling and traffic data via the connection (step 5).

FIG. 2 shows an exemplary message flow for peer-to-peer communication. In general, a message flow for peer-to-peer communication may include any number of messages and any type of message.

Figure 3:
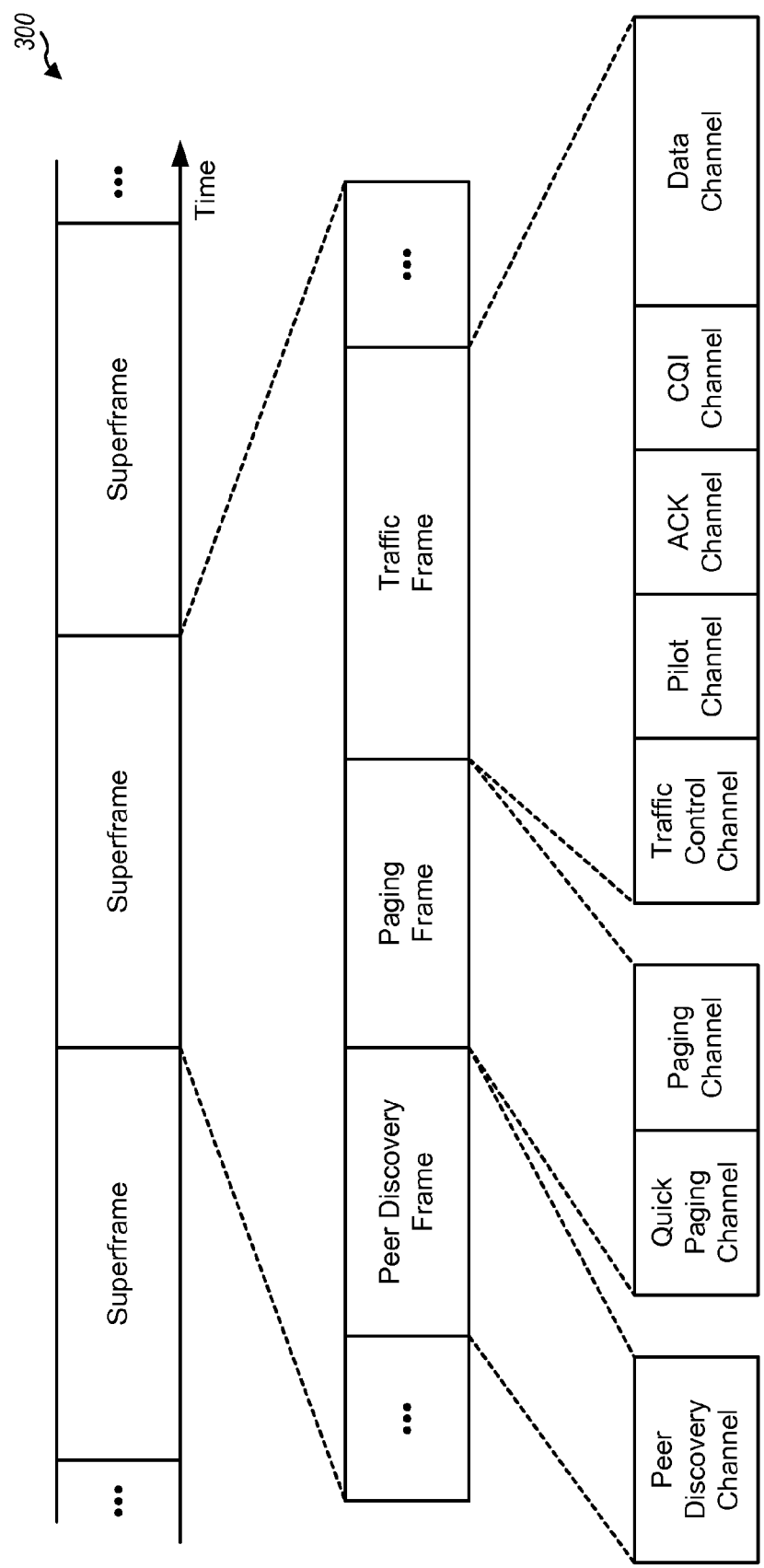
FIG. 3 shows a transmission structure.

FIG. 3 shows a design of a transmission structure 300 that may be used for wireless network 100. The transmission timeline may be partitioned into units of superframes. Each superframe may cover a fixed or variable time duration and may be partitioned into a number of frames. In the design shown in FIG. 3, different types of signals or information may be sent in different frames. Some frames may be used to send peer discovery signals and may be referred to as peer discovery frames. Some other frames may be used to send paging signals and may be referred to as paging frames. Many or most frames may be used to send data and may be referred to as traffic frames. Other types of frames may also be defined. The different types of frames may have the same or different time durations.

FIG. 3 also shows a design of a peer discovery frame, a paging frame, and a traffic frame. For a peer discovery frame, a peer discovery channel may be used by terminals to send peer discovery signals. For a paging frame, a quick paging channel (QPCH) may be used by terminals to indicate whether or not they will send paging messages in the paging frame. A paging channel (PCH) may carry paging messages from the terminals. For a traffic frame, a traffic control channel may carry control information sent by terminals. A pilot channel may carry pilots sent by the terminals. An acknowledgement (ACK) channel may carry ACKs for packets sent previously. A channel quality indicator (CQI) channel may carry CQI information sent by the terminals. A data channel may carry traffic data sent by the terminals. In general, each frame may be partitioned into any number of subframes for any number of channels and any channel type. The terminals may send signals in different manners for different channels.

The network may utilize OFDM and/or SC-FDM. OFDM and SC-FDM partition the system bandwidth into multiple (N) orthogonal subcarriers, which are also commonly referred to as tones, bins, etc. Each subcarrier may be modulated with data. In general, modulation symbols are sent in the frequency domain with OFDM and in the time domain with SC-FDM.

Figure 4A:
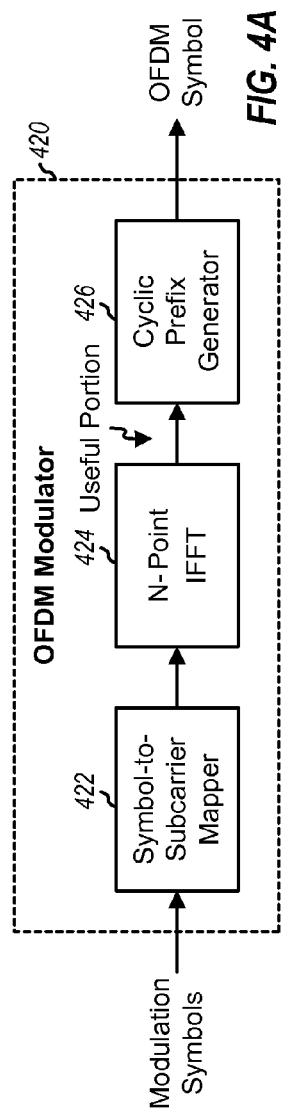
FIG. 4A shows a block diagram of an OFDM modulator.

FIG. 4A shows a block diagram of a design of an OFDM modulator 420. Within OFDM modulator 420, a symbol-to-subcarrier mapper 422 may receive modulation symbols, map the modulation symbols to subcarriers used for transmission, and map zero symbols with signal value of zero to the remaining subcarriers. An inverse fast Fourier transform (IFFT) unit 424 may receive N mapped symbols for the N total subcarriers, transform the N mapped symbols to the time domain with an N-point IFFT, and provide N time-domain samples, which are commonly referred to as a useful portion. Each sample is a complex value to be sent in one sample period. A cyclic prefix generator 426 may copy the last C samples of the useful portion and append these C samples to the front of the useful portion to obtain an OFDM symbol containing N+C samples. The copied portion is referred to as a cyclic prefix, and C is the cyclic prefix length. The cyclic prefix is used to combat inter-symbol interference (ISI) caused by frequency selective fading. The OFDM symbol may be sent in one OFDM symbol period (or simply, one symbol period).

Figure 4B:
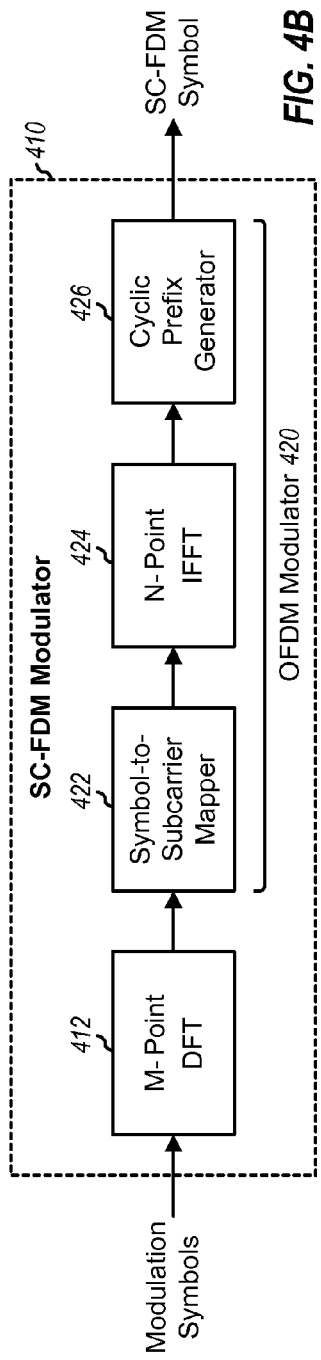
FIG. 4B shows a block diagram of an SC-FDM modulator.

FIG. 4B shows a block diagram of a design of an SC-FDM modulator 410, which includes a discrete Fourier transform (DFT) unit 412 followed by OFDM modulator 420. DFT unit 412 may receive M modulation symbols, transform these modulation symbols to the frequency domain with an M-point DFT, and provide M frequency-domain symbols. The M frequency-domain symbols may be mapped to M subcarriers by symbol-to-subcarrier mapper 422, transformed to the time domain by IFFT unit 424, and appended with a cyclic prefix by cyclic prefix generator 426 to obtain an SC-FDM symbol.

Figure 4C:
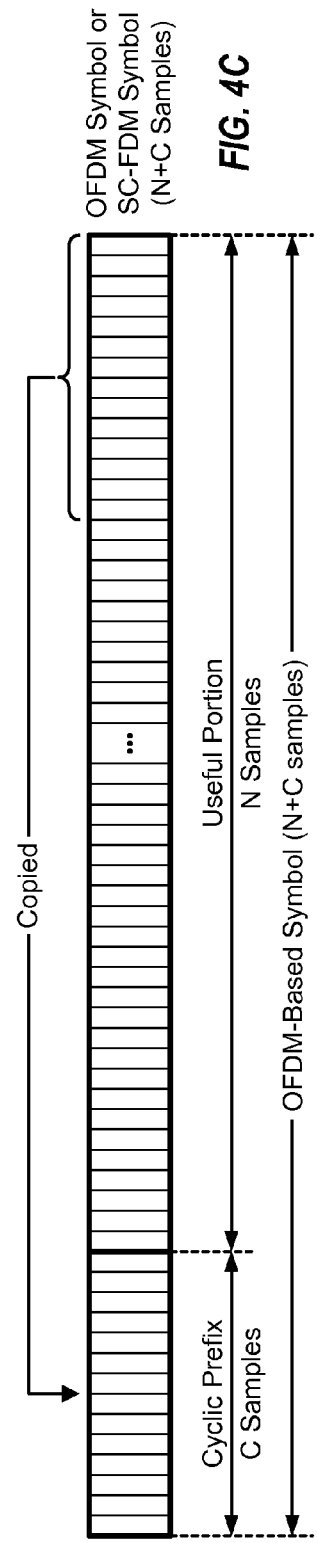
FIG. 4C shows an OFDM-based symbol.

FIG. 4C shows the structure of an OFDM symbol or SC-FDM symbol. The OFDM/SC-FDM symbol contains C samples for a cyclic prefix followed by N samples for a useful portion. The useful portion may also be referred to as a body portion or by some other terminology. The OFDM/SC-FDM symbol may be sent in one symbol period.

A demodulator at a receiver may receive an OFDM symbol or an SC-FDM symbol containing N+C samples and may discard all or a portion of the cyclic prefix. The demodulator may then process the next N samples after the discarded portion to recover the modulation symbols. The demodulator may transform the N samples to the frequency domain with an N-point fast Fourier transform (FFT) to obtain N received symbols. The demodulator may further process the received symbols for OFDM or SC-FDM to recover the modulation symbols.

In general, the network may utilize any numerology for FFT size and cyclic prefix length. The FFT size (N) is equal to the total number of subcarriers. In one design, the spacing between adjacent subcarriers may be fixed, and different FFT sizes may be used for different system bandwidth. In another design, the system bandwidth may be fixed, and different FFT sizes may be used for different channels. In one design, the cyclic prefix length may be a fixed or configurable percentage of the FFT size, e.g., C=N/4, N/8 or N/16. In another design, the cyclic prefix length may be fixed for different FFT sizes.

For all designs, the cyclic prefix length may be defined based on an expected delay spread in the network.

Table 1 shows a specific design of different FFT sizes and a fixed cyclic prefix length for different channel types. In this design, the system bandwidth may be fixed (e.g., 5 MHz), and the subcarrier spacing may be variable and dependent on the FFT size. The FFT size and cyclic prefix length may also be defined in other manners.

TABLE 1

| FFT Size (N) | Cyclic Prefix Length (C) | Channel |
|---|---|---|
| 32 | 24 | Traffic control channel |
| 64 | 24 | Peer discovery, quick paging, and paging channels |
| 128 | 24 | Pilot, ACK, CQI and data channels |
| 512 | 24 | Timing/synchronization channel |

The AGC techniques described herein may be used for OFDM-based symbols. An OFDM-based symbol may be an OFDM symbol, an SC-FDM symbol, etc. An OFDM-based symbol may include (i) a cyclic prefix composed of C samples followed by (ii) a useful portion composed of N samples. For clarity, certain aspects of the techniques are described below for OFDM symbols.

A terminal may receive signals from one or more transmitters at any given moment. The terminal may perform AGC in order to obtain the desired input signal level for an ADC at the terminal.

Figure 5:
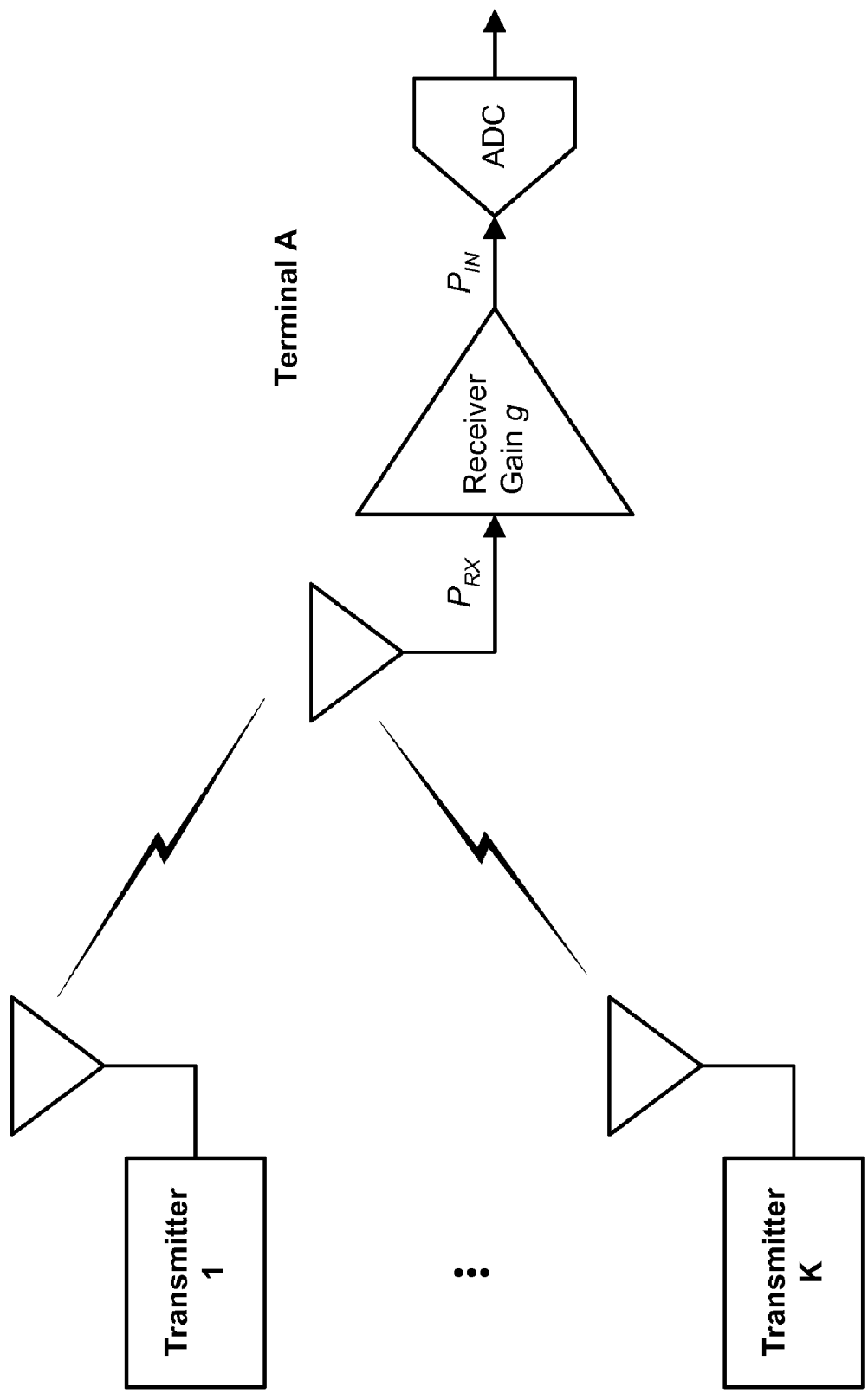
FIG. 5 shows transmission from multiple transmitters to a terminal.

FIG. 5 shows transmission from K transmitters 1 through K to terminal A, where K may be one or greater. Each transmitter may transmit a signal at a particular transmit power level via a wireless channel. Terminal A may receive the signal from each transmitter at a received power level determined by the transmit power level for the signal and the pathloss from that transmitter to terminal A. Terminal A may obtain a received signal comprising the signals from all K transmitters and having a received power level of $P_{RX}$. Terminal A may scale (e.g., amplify or attenuate) the received signal with a receiver gain of g and may obtain an ADC input signal having an input power level of $P_{IN}$. Terminal A may amplify the received signal if the receiver gain is greater than one or attenuate the received signal if the receiver gain is less than one.

Terminal A may perform AGC to obtain a target power level for the ADC input signal. For AGC, terminal A may (i) increase the receiver gain if the input power level is lower than the target power level or (ii) decrease the receiver gain if the input power level is higher than the target power level.

In an aspect, terminal A may perform AGC based on the cyclic prefix of a received OFDM symbol to obtain a receiver gain to use for the useful portion. The same transmitted signals are present in both the cyclic prefix and the useful portion. The cyclic prefix may thus be used as a training interval in which power can be measured and used to determine the receiver gain.

Figure 6:
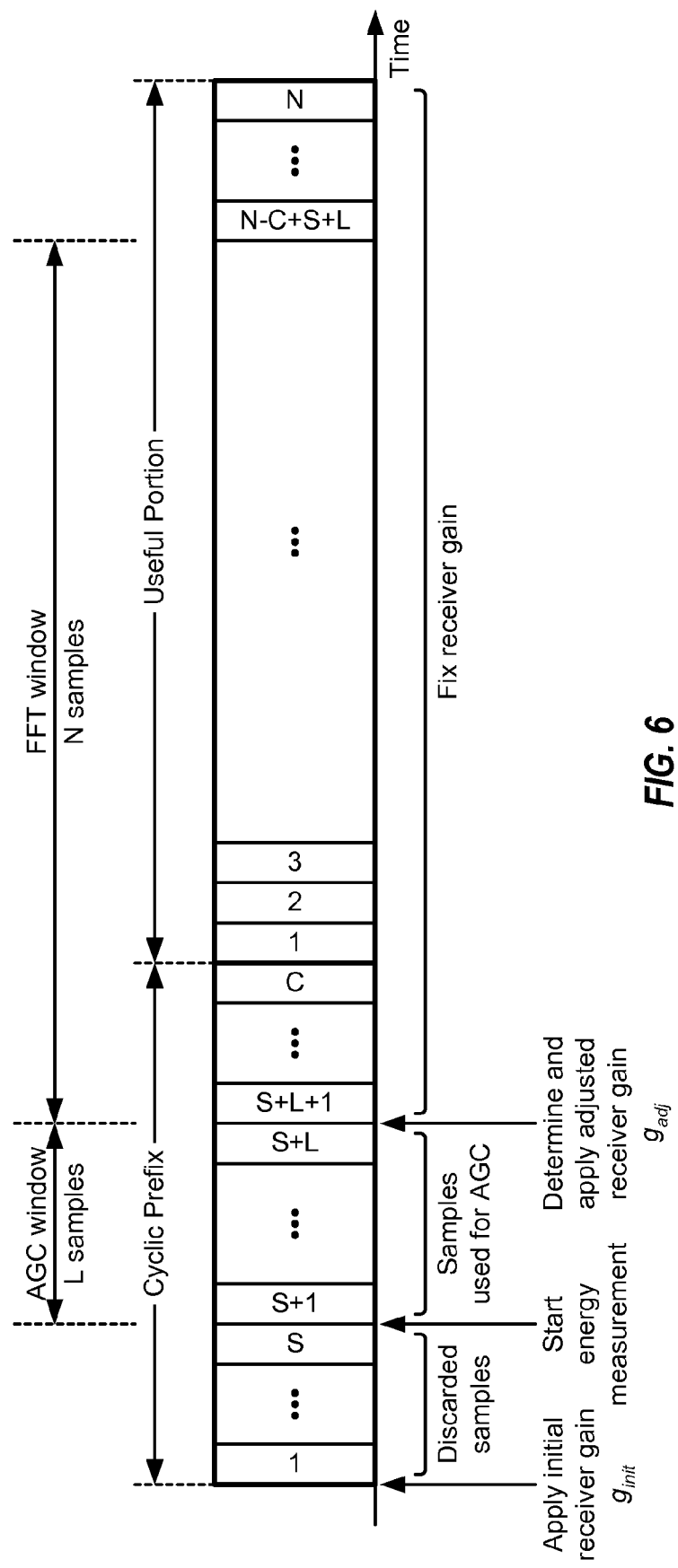
FIG. 6 shows a design of performing AGC for a received OFDM symbol.

FIG. 6 shows a design of performing AGC for a received OFDM symbol at terminal A. The received OFDM symbol may be composed of OFDM symbols transmitted by different transmitters in one symbol period. The transmitted OFDM symbols may arrive at terminal A with different gains and propagation delays.

Terminal A may know the start of the received OFDM symbol, e.g., based on timing information obtained from a base station. Terminal A may place an FFT window of size N such that it starts at the beginning of the useful portion or near the end of the cyclic prefix. Terminal A may process the N samples in the FFT window to recover modulation symbols sent by the transmitters.

Terminal A may perform AGC based on L samples within an AGC window, which may precede the FFT window, as shown in FIG. 6. In general, the number of samples (L) used for AGC may be all or a subset of the C samples in the cyclic prefix. In one design, terminal A may skip the first S samples in the cyclic prefix and may avoid using these S samples for AGC. The first S samples may contain transmitted signals from nearby transmitters with short propagation delays whereas subsequent samples may contain transmitted signals from all or many transmitters within detection range of terminal A. S may be selected based on various factors such as the expected delay spread in the network, the duration of each sample, etc. In one design, S may be a fixed value, e.g., S=4. In another design, S may be a configurable value that may be dependent on the FFT size, the cyclic prefix length, etc. For both designs, the AGC window may cover samples S+1 through S+L before the start of the FFT window.

Terminal A may determine an initial receiver gain $g_{init}$ for the received OFDM symbol as described below. Terminal A may apply this initial receiver gain at the start of the received OFDM symbol. In one design, terminal A may measure the power of the L samples in the AGC window, as follows:

$$P_{CP} = \frac{1}{L} \cdot \sum_{n=S+1}^{S+L} I_n^2 + Q_n^2, \qquad \text{Eq (1)}$$

where $I_n$ and $Q_n$ are inphase and quadrature components of the n-th sample, and $P_{CP}$ is the measured power of the samples in the cyclic prefix.

The terms "power" and "energy" are often used interchangeably.

By discarding the first S samples in the cyclic prefix, the measured power $P_{CP}$ of the next L samples may be a more accurate estimate of the power of the useful portion. In another design, terminal A may compute the power of each sample as $P_n = I_n^2 + Q_n^2$ and may filter the sample power, e.g., with a finite impulse response (FIR) filter or an infinite impulse response (IIR) filter. Terminal A may use the filtered power value for the last sample S+L as the measured power. Terminal A may also measure the power of the samples in the cyclic prefix in other manners.

In one design, terminal A may adjust the receiver gain based on the measured power, as follows:

$$g_{adj} = g_{init} \cdot \sqrt{\frac{P_{target}}{P_{CP}}}, \qquad \text{Eq (2)}$$

where $P_{target}$ is a target power for the received OFDM symbol, and $g_{adj}$ is an adjusted receiver gain.

In the design shown in equation (2), terminal A may adjust the receiver gain such that the power of the samples in the AGC window, with the adjusted receiver gain applied, is at the target power. Terminal A may use the adjusted receiver gain for remaining samples in the received OFDM symbol.

In another design, terminal A may iteratively measure the power of the samples in the cyclic prefix and adjust the receiver gain. Terminal A may obtain a measured power for each sample or each set of samples. Terminal A may compare the measured power against the target power and may (i) increase the receiver gain if the measured power is below the target power or (ii) decrease the receiver gain if the measured power is above the target power.

In yet another design, terminal A may perform clipping detection and may adjust the receiver gain to obtain the desired ADC input signal level. Terminal A may count the number of samples that are clipped by the ADC (or are above a threshold) among the L samples used for AGC. If a transmitted signal has a sinusoidal waveform, then terminal A can estimate the signal peak based on the number of samples that is clipped by the ADC (or exceeds the threshold). Terminal A may then adjust the receiver gain such that the signal peak is not clipped by the ADC. Terminal A may store a table of receiver gain versus number of clipped samples. The entries in this table may be determined based on computer simulation, empirical measurement, etc. Terminal A may provide the counted number of clipped sampled to the table and may obtain the adjusted receiver gain from the table. AGC based on clipping detection may be used when the waveform is known (e.g., sinusoidal) and also when the waveform is pseudo-random.

Terminal A may also adjust the receiver gain in other manners based on the cyclic prefix. In general, terminal A may determine one or more metrics (e.g., measured power, number of clipped samples, etc.) based on the samples in the cyclic prefix. Terminal A may then adjust the receiver gain based on the metric(s).

In one design, terminal A may use the adjusted receiver gain $g_{adj}$ for the entire useful portion of the received OFDM symbol, as shown in FIG. 6. In another design, terminal A may continue to measure the power of the samples in the useful portion and may update the receiver gain with the measured power.

FIG. 6 shows AGC for one received OFDM symbol. Terminal A may obtain a sequence of received OFDM symbols. Terminal A may perform AGC for the OFDM symbol sequence in different manners depending on the content of the received OFDM symbols.

Figure 7A:
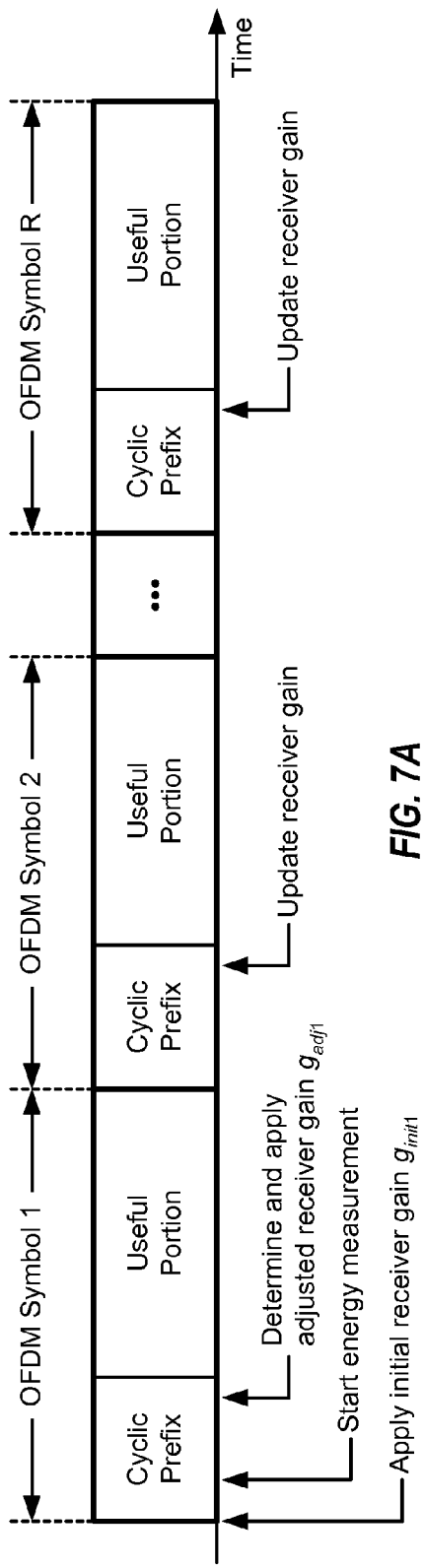
FIGS. 7A and 7B show two designs of performing AGC for a sequence of received OFDM symbols.

FIG. 7A shows a design of performing AGC for a sequence of received OFDM symbols 1 through R, where R may be any integer value. In this design, the received OFDM symbols may contain signals from the same set of transmitters. Terminal A may determine an initial receiver gain $g_{init1}$ and may apply this receiver gain at the start of the first OFDM symbol. Terminal A may measure the power of samples in the cyclic prefix of the first OFDM symbol (e.g., after discarding the first S samples) and may obtain measured power $P_{CP1}$. Terminal A may then adjust the receiver gain based on the measured power $P_{CP1}$ (e.g., as shown in equation (2)) and may used the adjusted receiver gain $g_{adj1}$ for the useful portion of the first OFDM symbol.

In one design, terminal A may use the adjusted receiver gain $g_{adj1}$ for all remaining received OFDM symbols (not shown in FIG. 7A). In another design, terminal A may update the receiver gain for each subsequent received OFDM symbol (as shown in FIG. 7A). Terminal A may update the receiver gain at the start of the cyclic prefix (not shown in FIG. 7A) or at the start of the useful portion of each subsequent OFDM symbol (as shown in FIG. 7A). Terminal A may measure the power of the useful portion of the first OFDM symbol and the cyclic prefix of the second OFDM symbol and may obtain measured power $P_2$. Terminal A may then update the receiver gain based on the measured power $P_2$ and may apply the updated receiver gain $g_{adj2}$ for the useful portion of the second OFDM symbol. Terminal A may repeat the process for each subsequent OFDM symbol.

Terminal A may measure the power of the samples in the received OFDM symbols in various manners. In one design, terminal A may compute the power of each sample and may filter the energies of the samples. At each update time instant, terminal A may use the latest filtered power value to update the receiver gain. In another design, terminal A may restart the power measurement whenever the receiver gain is updated and may obtain a measured power for a measurement period from the last update time instant to the current update time instant. Terminal A may then use the measured power to update the receiver gain. Terminal A may also measure power and update the receiver gain in other manners for the received OFDM symbols in FIG. 7A.

Figure 7B:
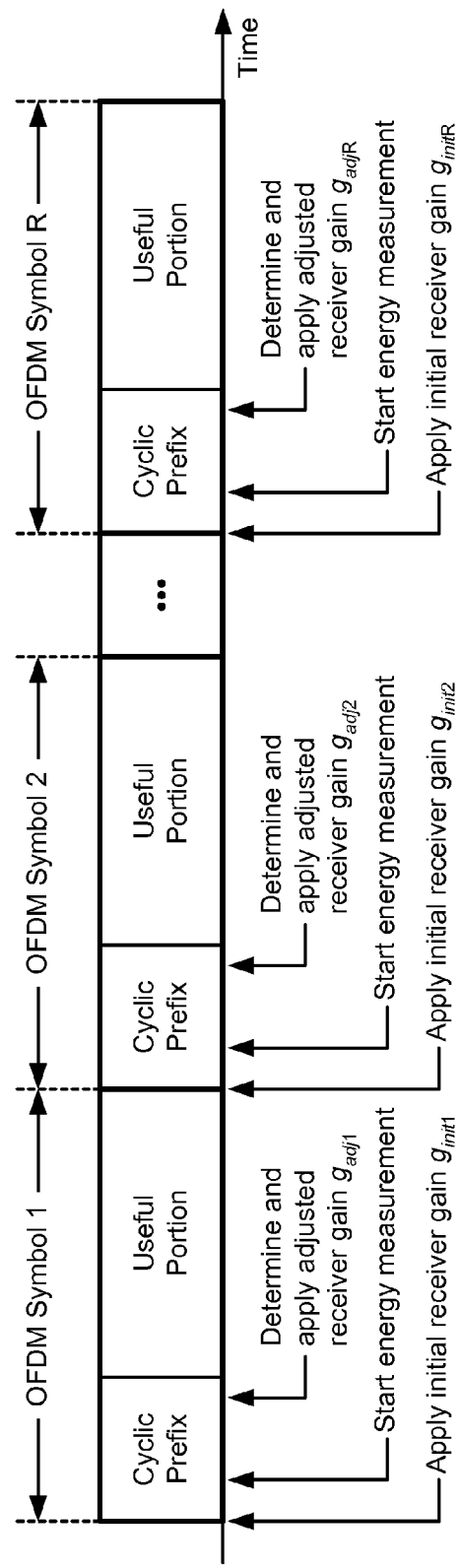

FIG. 7B shows another design of performing AGC for a sequence of received OFDM symbols. In this design, each received OFDM symbol may contain signals from a different set of transmitters. Terminal A may determine and apply an initial receiver gain $g_{init1}$ for the first OFDM symbol. Terminal A may measure the power of the samples in the cyclic prefix of the first OFDM symbol (e.g., after discarding the first S samples) and may obtain measured power $P_{CP1}$. Terminal A may then adjust the receiver gain based on the measured power $P_{CP1}$ and may apply the adjusted receiver gain $g_{adj1}$ for the useful portion of the first OFDM symbol.

Terminal A may repeat the process for each subsequent OFDM symbol. Terminal A may determine and apply an initial receiver gain $g_{initn}$ for each received OFDM symbol. Terminal A may adjust the receiver gain based on the measured power for the cyclic prefix of the received OFDM symbol and may use the adjusted receiver gain $g_{adjn}$ for the remainder of the received OFDM symbol. Terminal A may perform AGC independently for each received OFDM symbol in the sequence.

Terminal A may determine an initial receiver gain for a received OFDM symbol in various manners. In one design, terminal A may set the initial receiver gain to a predetermined value, e.g., a high receiver gain, a mid receiver gain, a low receiver gain, etc. In another design, terminal A may set the initial receiver gain based on received power levels of transmitters expected to be received in a symbol period. In yet another design, terminal A may have a pattern of different receiver gains and may cycle through the pattern. Terminal A may set the initial receiver gain to an applicable receiver gain in the pattern. Terminal A may also set the initial receiver gain in other manners.

Figure 8:
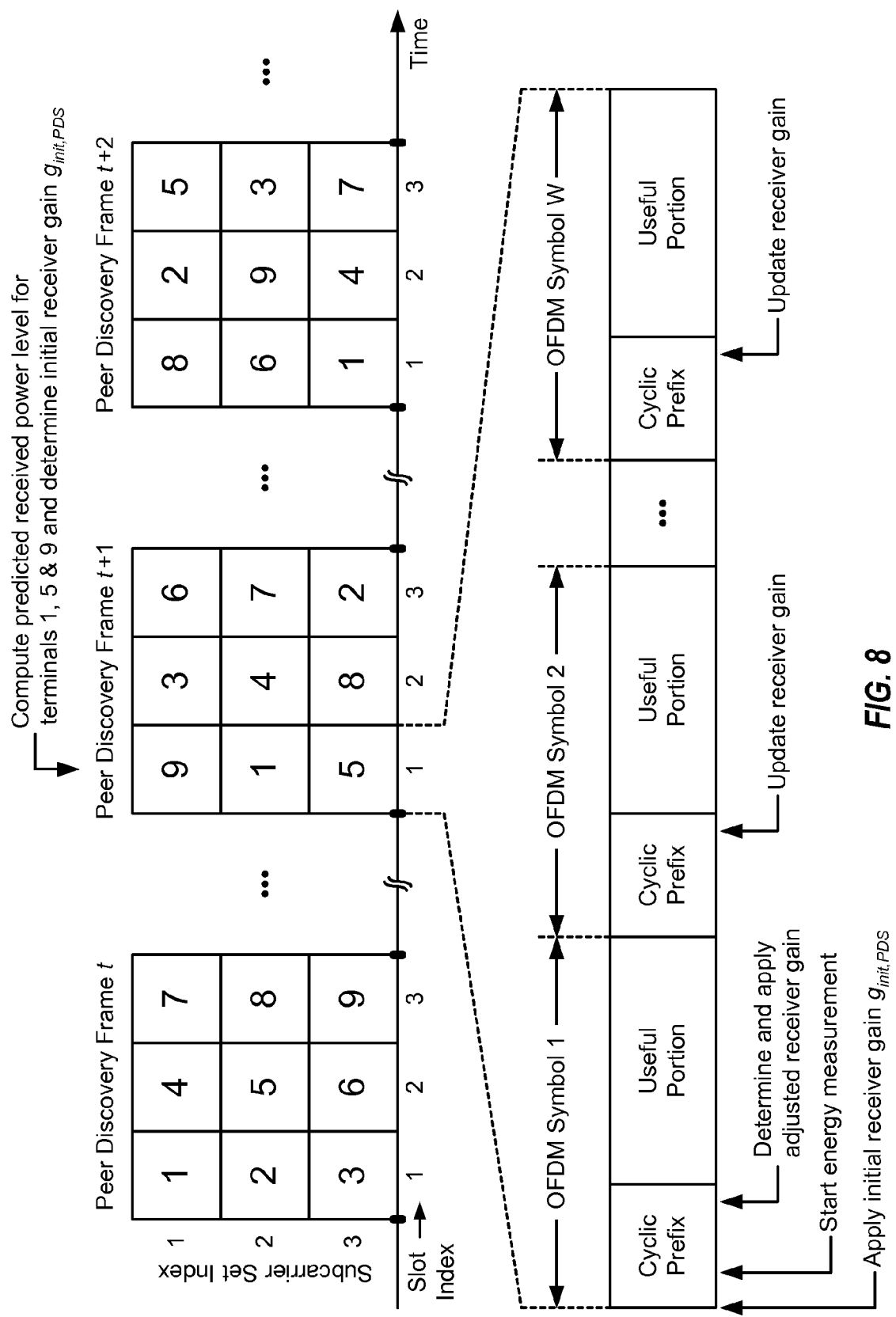
FIG. 8 shows AGC for peer discovery signals.

FIG. 8 shows example transmission of peer discovery signals with time and frequency hopping. A peer discovery frame may span multiple slots and may be partitioned into resource blocks. Each resource block may cover a set of one or more subcarriers in one slot. In general, a peer discovery frame may include P*Q resource blocks formed by P subcarrier sets in Q slots. In the example shown in FIG. 8, P=3, Q=3, and a peer discovery frame includes nine resource blocks formed by three subcarrier sets 1, 2 and 3 in three slots 1, 2 and 3. Nine terminals 1 through 9 may transmit their peer discovery signals on the nine resource blocks in each peer discovery frame. In FIG. 8, each resource block (p,q) has a label k that indicates the terminal using that resource block for the peer discovery signal, where p ∈ {1, 2, 3}, q ∈ {1, 2, 3} and k ∈ {1, . . . , 9}. For example, terminal 5 uses resource block (2,2) in peer discovery frame t, resource block (3,1) in peer discovery frame t+1, and resource block (1,3) in peer discovery frame t+2.

Terminal A may measure the received power levels of the peer discovery signals from terminals 1 through 9 in peer discovery frame t. Terminal A may be able to ascertain the resource block used by each peer terminal in peer discovery frame t+1 based on a known hopping function and known frame timing. Terminal A may compute a predicted received power level for each slot in peer discovery frame t+1 based on the measured received power levels for terminals 1 through 9, as follows:

$$P_{PRE,1}(t+1) = P_{RX,1}(t) + P_{RX,5}(t) + P_{RX,9}(t), \quad \text{Eq (3a)}$$

$$P_{PRE,2}(t+1) = P_{RX,3}(t) + P_{Rx,4}(t) + P_{RX,8}(t), \text{ and} \quad \text{Eq (3b)}$$

$$P_{PRE,3}(t+1) = P_{RX,2}(t) + P_{RX,6}(t) + P_{RX,7}(t), \quad \text{Eq (3c)}$$

where $P_{PX,k}(t)$ is the received power level of the peer discovery signal from peer terminal k in peer discovery frame t, and $P_{PRE,q}(t+1)$ is the predicted received power level for slot q in peer discovery frame t+1.

Terminal A may determine an initial receiver gain for each slot in peer discovery frame t+1, as follows:

$$g_{init,PDS,q}(t+1) = \sqrt{\frac{P_{PDS\_target}}{P_{PRE,q}(t+1)}}, \quad \text{Eq (4)}$$

where $P_{PDS\_target}$ is a target power level for peer discovery signals, and $g_{init,PDS,q}(t+1)$ is an initial receiver gain for slot q in peer discovery frame t+1.

Terminal A may obtain an initial receiver gain for each slot in peer discovery frame t+1. The initial receiver gain for each slot may be dependent on the received power levels for peer terminals expected to be received in that slot, e.g., as shown in equation set (3). The initial receiver gain for each slot may be such that the total received power level for that slot, after scaling by the initial receiver gain, is at or near the target power level.

As shown in FIG. 8, each slot may include W symbol periods. The same set of terminals may transmit their peer discovery signals in all W symbol periods of one slot. Terminal A may perform AGC for the W received OFDM symbols in each slot as described above for FIG. 7A.

Figure 9:
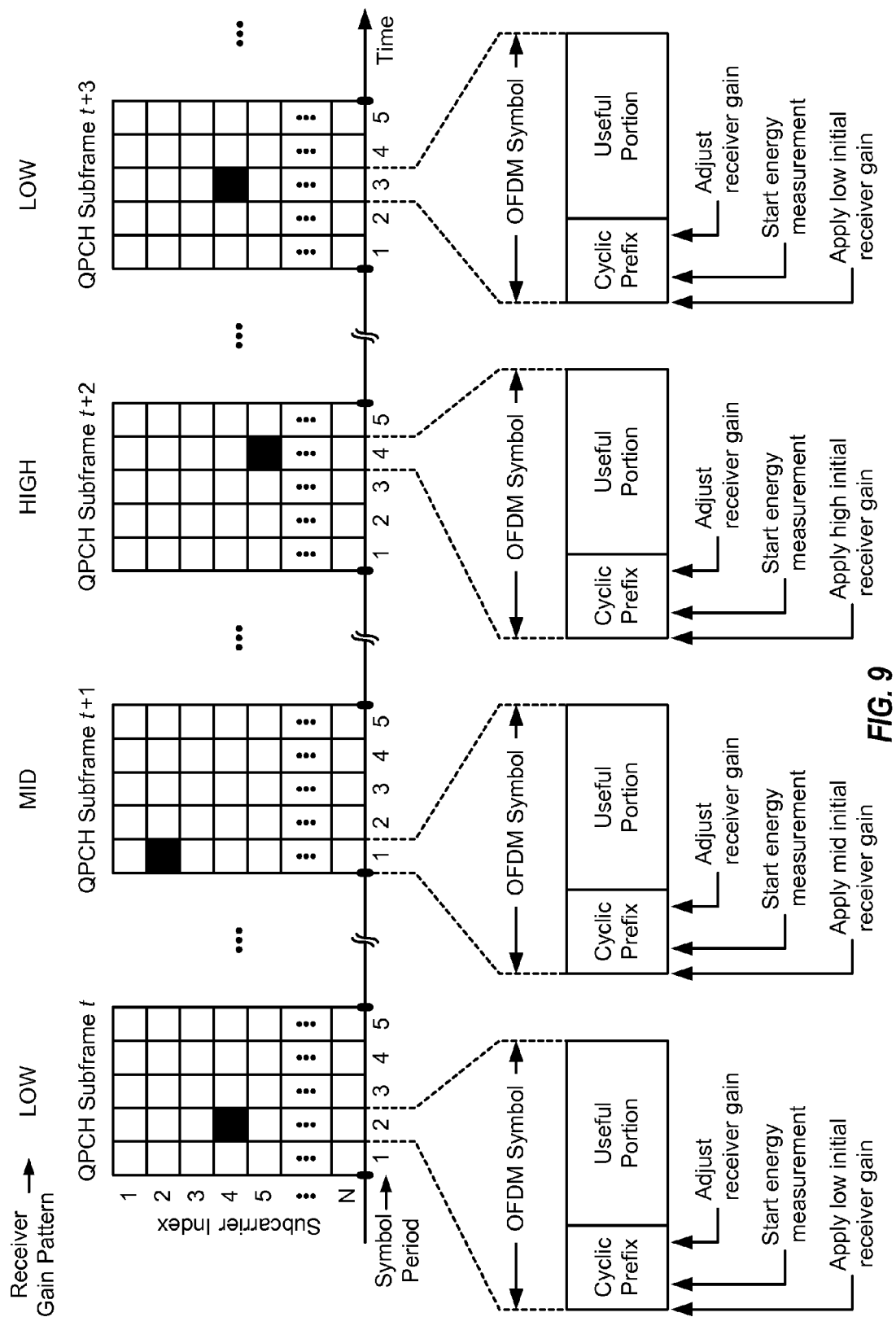
FIG. 9 shows AGC for quick paging signals.

FIG. 9 shows example transmission of quick paging signals. A paging frame may include a QPCH subframe and a PCH subframe. The QPCH subframe may span multiple (e.g., five) symbol periods and may be partitioned into resource elements. Each resource element may cover a set of one or more subcarriers in one symbol period. Each terminal may be assigned a unique resource element in each QPCH subframe. The assigned resource element may be static (not shown in FIG. 9) or may hop from QPCH subframe to QPCH subframe (as shown in FIG. 9). A given terminal X may page terminal A by (i) sending a quick paging signal on the resource element assigned to terminal A and (ii) sending a paging signal in the following PCH subframe to terminal A.

In one design that is not shown in FIG. 9, terminal A may use a fixed initial receiver gain to receive the quick paging signals from peer terminals. This fixed initial receiver gain may be a low receiver gain, a mid receiver gain, a high receiver gain, etc.

In another design that is shown in FIG. 9, terminal A may use different initial receiver gains for different QPCH subframes. Terminal A may have a pattern of different receiver gains and may cycle through the pattern and select an initial receiver gain for each QPCH subframe. In the example shown in FIG. 9, the pattern includes low, mid, and high receiver gains. Terminal A may use low initial receiver gain for QPCH subframe t, then mid initial receiver gain for QPCH subframe t+1, then high initial receiver gain for QPCH subframe t+2, then back to low initial receiver gain for QPCH subframe t+3, etc.

For both designs, other terminals may know the initial receiver gain used by terminal A for each QPCH subframe. Each terminal may also know the pathloss from that terminal to terminal A. A given terminal X may (i) select an appropriate QPCH subframe to send a quick paging signal to terminal A and (ii) compute the transmit power level for the quick paging signal based on the pathloss from terminal X to terminal A, the initial receiver gain for the QPCH subframe, and a target input power level.

Terminal A may process a received OFDM symbol containing its assigned resource element in each QPCH subframe. The received power level for the received OFDM symbol may be dependent on (i) whether a quick paging signal has been sent to terminal A in the resource element assigned to terminal A and (ii) whether quick paging signals have been sent to other terminals in other resource elements. Terminal A may select an initial receiver gain based on one of the designs described above. Terminal A may perform AGC for the received OFDM symbol as described above for FIG. 6. Terminal A may measure the power of the samples in the cyclic prefix, adjust the receiver gain based on the measured power, and use the adjusted receiver gain for the useful portion.

Terminal A may detect a quick paging signal on its assigned resource element in a QPCH subframe. Terminal A may then process the associated PCH subframe to detect for a paging signal sent to terminal A. Terminal A may use the adjusted receiver gain obtained for the QPCH subframe as an initial receiver gain for the PCH subframe. The set of terminals transmitting quick paging signals in the OFDM symbol containing the resource element assigned to terminal A may be different from the set of terminals transmitting paging signals in the PCH subframe. Furthermore, the PCH subframe may be partitioned into multiple resource elements, and different terminals may transmit their paging signals on different subsets of the resource elements in the PCH subframe. Terminal A may thus perform AGC for the received OFDM symbols in the PCH subframe, e.g., as shown in FIG. 7A or 7B.

Terminal A may receive a paging signal in the PCH subframe and may thereafter receive control information and data in a traffic frame. In one design, terminal A may use the adjusted receiver gain obtained for the PCH subframe as an initial receiver gain for the traffic frame.

The traffic control channel may be sent in multiple symbol periods. In one design, a different set of terminals may send control information on the traffic control channel in each symbol period. In this case, terminal A may perform AGC independently for each received OFDM symbol for the traffic control channel, e.g., as shown in FIG. 7B.

The data channel may be sent in multiple slots, and each slot may cover multiple symbol periods. In one design, only one terminal may send data on the data channel in each slot. In another design, multiple terminals may concurrently send data on the data channel in the same slot. For both designs, terminal A may perform AGC for the received OFDM symbols in a slot, e.g., as shown in FIG. 7A or 7B.

The AGC techniques described herein may provide certain advantages. First, AGC may be performed based on a cyclic prefix that is already transmitted for each OFDM-based symbol. No additional overhead (e.g., no preamble in front of an OFDM-based symbol) is needed to support AGC. Second, efficient multiplexing of signals from different transmitters may be supported. For example, different sets of transmitters may send signals in consecutive OFDM-based symbols, e.g., for the QPCH and the traffic control channel. AGC may be performed for each OFDM-based symbol to obtain good reception performance for the set of transmitters transmitting in that OFDM-based symbol.

FIG. 10 shows a design of a process 1000 for performing AGC by a receiver, which may be part of a terminal, a base station, or some other entity. The receiver may receive a first OFDM-based symbol (e.g., an OFDM symbol or an SC-FDM symbol) comprising a cyclic prefix and a useful portion (block 1012). The receiver may scale (e.g., amplify or attenuate) the first OFDM-based symbol based on an initial receiver gain (block 1014). The receiver may adjust the initial receiver gain based on the cyclic prefix of the first OFDM-based symbol to obtain an adjusted receiver gain (block 1016). The receiver may apply the adjusted receiver gain prior to the useful portion of the first OFDM-based symbol (block 1018). The receiver may then process the useful portion to recover at least one signal sent by at least one transmitter (block 1020).

The receiver may select the initial receiver gain and apply this initial receiver gain at the start of the first OFDM-based symbol. In one design, the receiver may identify at least one transmitter expected to transmit in the first OFDM-based symbol, e.g., as shown in FIG. 8. The receiver may determine the received power level for each transmitter based on a signal received from that transmitter in at least one prior OFDM-based symbol. The receiver may determine a predicted received power level based on the received power level of each transmitter and may determine the initial receiver gain based on the predicted received power level, e.g., as shown in equation (4). In another design, the receiver may select the initial receiver gain by cycling through a pattern of different receiver gains, e.g., as shown in FIG. 9. In yet another design, the receiver may set the initial receiver gain to a predetermined value, e.g., a high, mid, or low receiver gain. The receiver may also select the initial receiver gain in other manners.

The receiver may adjust the initial receiver gain in block 1016 in various manners. In one design, the receiver may measure the power of a set of samples in the cyclic prefix of the first OFDM-based symbol. The set of samples may exclude a predetermined number of earliest samples in the cyclic prefix, e.g., as shown in FIG. 6. The receiver may adjust the initial receiver gain based on the measured power and a target power for the first OFDM-based symbol, e.g., as shown in equation (2). In another design, the receiver may count the number of samples with power exceeding a threshold among the set of samples. The receiver may then adjust the initial receiver gain based on the number of samples with power exceeding the threshold. The receiver may also adjust the initial receiver gain in other manners.

The receiver may receive a second OFDM-based symbol following the first OFDM-based symbol. In one design, the first and second OFDM-based symbols may have the same set of transmitters, e.g., as shown in FIG. 7A. The receiver may determine a second receiver gain based on the adjusted receiver gain for the first OFDM-based symbol. For example, the receiver may update the adjusted receiver gain based on the useful portion of the first OFDM-based symbol and/or the cyclic prefix of the second OFDM-based symbol. The receiver may then scale the second OFDM-based symbol based on the second receiver gain. The first and second OFDM-based symbols may be for a peer discovery channel, a data channel, etc.

In another design, the first and second OFDM-based symbols may potentially have different sets of transmitters, e.g., as shown in FIG. 7B. The receiver may scale the second OFDM-based symbol based on a second initial receiver gain, which may be determined based on any of the designs described above. The receiver may adjust the second initial receiver gain based on the cyclic prefix of the second OFDM-based symbol to obtain a second adjusted receiver gain. The receiver may then apply the second adjusted receiver gain prior to the useful portion of the second OFDM-based symbol. The first and second OFDM-based symbols may be for a traffic control channel, a quick paging channel, a paging channel, etc.

FIG. 11 shows a design of an apparatus 1100 for performing AGC. Apparatus 1100 includes a module 1112 to receive an OFDM-based symbol comprising a cyclic prefix and a useful portion, a module 1114 to scale the OFDM-based symbol based on an initial receiver gain, a module 1116 to adjust the initial receiver gain based on the cyclic prefix of the OFDM-based symbol to obtain an adjusted receiver gain, a module 1118 to apply the adjusted receiver gain prior to the useful portion of the OFDM-based symbol, and a module 1120 to process the useful portion to recover at least one signal sent by at least one transmitter. The modules in FIG. 11 may comprise processors, electronics devices, hardware devices, electronics components, logical circuits, memories, etc., or any combination thereof.

Figure 12:
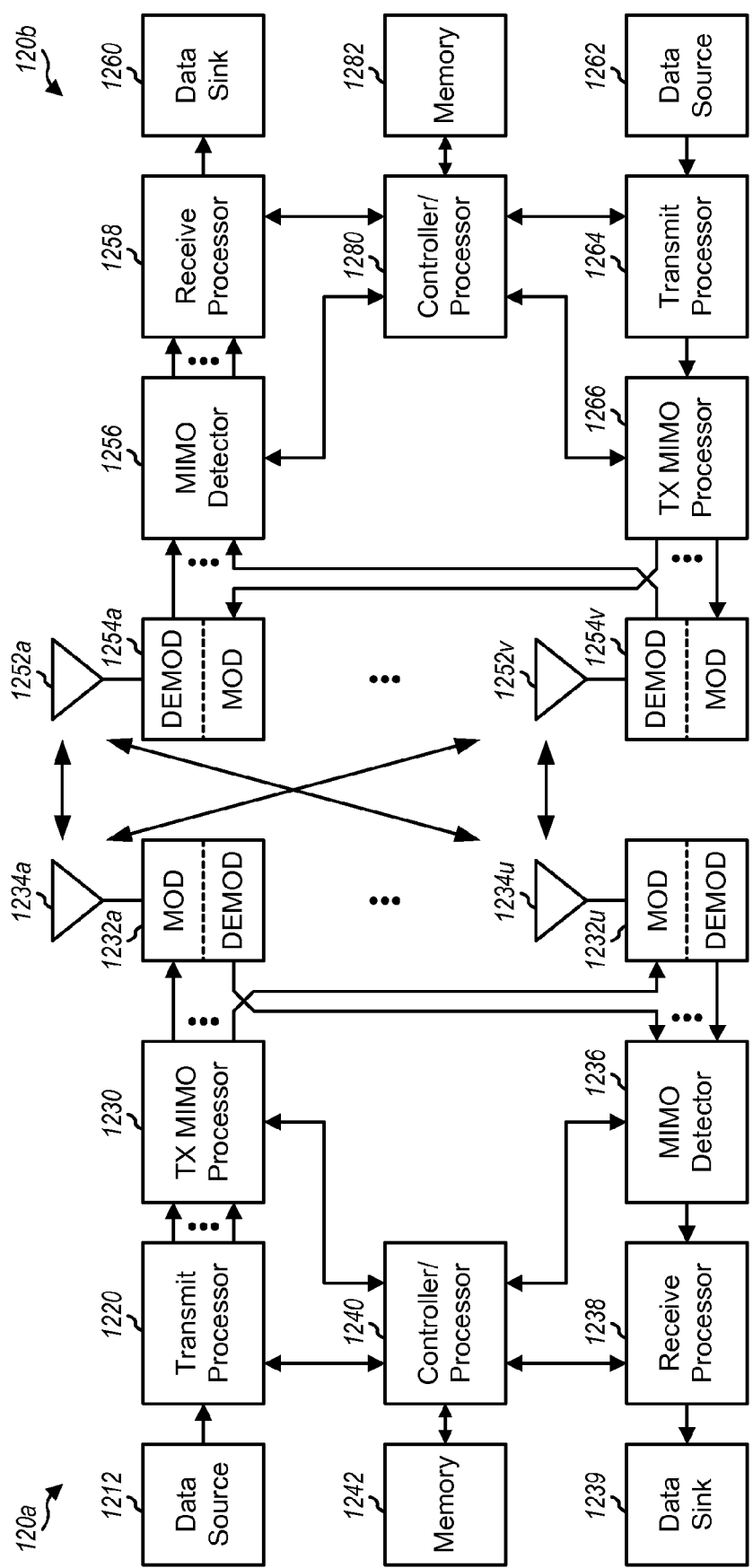
FIG. 12 shows a block diagram of two terminals.

FIG. 12 shows a block diagram of a design of terminals 120a and 120b, which are two terminals in wireless network 100 in FIG. 1. In this design, terminal 120a is equipped with U antennas 1234a through 1234u, and terminal 120b is equipped with V antennas 1252a through 1252v, where in general $U \geq 1$ and $V \geq 1$.

At terminal 120a, a transmit processor 1220 may receive data from a data source 1212 and control information from a controller/processor 1240. The control information may comprise information to send in any of the channels shown in FIG. 3. Transmit processor 1220 may process (e.g., encode, interleave, and modulate) the data and control information and provide data symbols and control symbols, respectively. A transmit (TX) multiple-input multiple-output (MIMO) processor 1230 may perform spatial processing (e.g., precoding) on the data symbols, the control symbols, and/or pilot symbols, if applicable, and may provide U output symbol streams to U modulators (MODs) 1232a through 1232u. Each modulator 1232 may process a respective output symbol stream (e.g., for OFDM, SC-FDM, etc.) to obtain an output sample stream. Each modulator 1232 may further process (e.g., convert to analog, amplify, filter, and upconvert) the output sample stream to obtain a radio frequency (RF) signal. U RF signals from modulators 1232a through 1232u may be transmitted via U antennas 1234a through 1234u, respectively.

At terminal 120b, antennas 1252a through 1252v may receive the RF signals from terminal 120a and may provide received signals to demodulators (DEMODs) 1254a through 1254v, respectively. Each demodulator 1254 may condition (e.g., filter, amplify, downconvert, and digitize) a respective received signal to obtain received samples. Each demodulator 1254 may further process the received samples (e.g., for OFDM, SC-FDM, etc.) to obtain received symbols. A MIMO detector 1256 may obtain received symbols from all V demodulators 1254a through 1254v, perform MIMO detection on the received symbols if applicable, and provide detected symbols. A receive processor 1258 may process (e.g., demodulate, deinterleave, and decode) the detected symbols, provide decoded data to a data sink 1260, and provide decoded control information to a controller/processor 1280.

At terminal 120b, data from a data source 1262 and control information from controller/processor 1280 may be processed by a transmit processor 1264, precoded by a TX MIMO processor 1266 if applicable, further processed by modulators 1254, and transmitted via antennas 1252. At terminal 120a, the RF signals from terminal 120b may be received by antennas 1234, processed by demodulators 1232, detected by a MIMO detector 1236 if applicable, and further processed by a receive processor 1238 to obtain the decoded data and control information transmitted by terminal 120b.

Controllers/processors 1240 and 1280 may direct the operation at terminals 120a and 120b, respectively. Controllers/processors 1240 and 1280 may each perform or direct process 1000 in FIG. 10 and/or other processes for the techniques described herein. Memories 1242 and 1282 may store data and program codes for terminals 120a and 120b, respectively. Demodulators 1232 and 1254 may perform AGC based on the cyclic prefix of received OFDM symbols, as described above.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for wireless communication, comprising:
   receiving a first orthogonal frequency division multiplexing (OFDM)-based symbol comprising a cyclic prefix and a useful portion;
   scaling the first OFDM-based symbol based on an initial receiver gain; and
   adjusting the initial receiver gain based on the cyclic prefix of the first OFDM-based symbol.

2. The method of claim 1, further comprising:
   applying the adjusted receiver gain prior to the useful portion of the first OFDM-based symbol; and
   processing the useful portion to recover at least one signal sent by at least one transmitter.

3. The method of claim 1, wherein the adjusting the initial receiver gain comprises
measuring power of a set of samples in the cyclic prefix of the first OFDM-based symbol, and
adjusting the initial receiver gain based on the measured power.

4. The method of claim 3, wherein the initial receiver gain is adjusted based further on a target power for the first OFDM-based symbol.

5. The method of claim 3, wherein the set of samples excludes a predetermined number of earliest samples in the cyclic prefix.

6. The method of claim 1, wherein the adjusting the initial receiver gain comprises
counting number of samples with power exceeding a threshold among a set of samples in the cyclic prefix of the first OFDM-based symbol, and
adjusting the initial receiver gain based on the number of samples with power exceeding the threshold.

7. The method of claim 1, further comprising:
selecting the initial receiver gain; and
applying the initial receiver gain at start of the first OFDM-based symbol.

8. The method of claim 7, wherein the selecting the initial receiver gain comprises
identifying at least one transmitter expected to transmit in the first OFDM-based symbol, and
determining the initial receiver gain based on a predicted received power level for the at least one transmitter.

9. The method of claim 8, wherein the selecting the initial receiver gain further comprises
determining a received power level for each of the at least one transmitter based on a signal received from the transmitter in at least one prior OFDM-based symbol, and
determining the predicted received power level based on the received power level of each of the at least one transmitter.

10. The method of claim 7, wherein the selecting the initial receiver gain comprises selecting the initial receiver gain by cycling through a pattern of different receiver gains.

11. The method of claim 7, wherein the selecting the initial receiver gain comprises setting the initial receiver gain to a predetermined value.

12. The method of claim 1, further comprising:
receiving a second OFDM-based symbol following the first OFDM-based symbol, the first and second OFDM-based symbols having same set of transmitters;
determining a second receiver gain based on the adjusted receiver gain for the first OFDM-based symbol; and
scaling the second OFDM-based symbol based on the second receiver gain.

13. The method of claim 12, wherein the determining a second receiver gain comprises updating the adjusted receiver gain based on at least one of the useful portion of the first OFDM-based symbol and the cyclic prefix of the second OFDM-based symbol to obtain the second receiver gain.

14. The method of claim 12, wherein the first and second OFDM-based symbols are for a peer discovery channel or a data channel.

15. The method of claim 1, further comprising:
receiving a second OFDM-based symbol following the first OFDM-based symbol, the first and second OFDM-based symbols potentially having different sets of transmitters;
scaling the second OFDM-based symbol based on a second initial receiver gain; and
adjusting the second initial receiver gain based on the cyclic prefix of the second OFDM-based symbol.

16. The method of claim 15, wherein the first and second OFDM-based symbols are for a traffic control channel, a quick paging channel, or a paging channel.

17. The method of claim 1, wherein the first OFDM-based symbol comprises an OFDM symbol or a single-carrier frequency division multiplexing (SC-FDM) symbol.

18. An apparatus for wireless communication, comprising:
at least one processor configured to receive a first orthogonal frequency division multiplexing (OFDM)-based symbol comprising a cyclic prefix and a useful portion, to scale the first OFDM-based symbol based on an initial receiver gain, and to adjust the initial receiver gain based on the cyclic prefix of the first OFDM-based symbol.

19. The apparatus of claim 18, wherein the at least one processor is configured to measure power of a set of samples in the cyclic prefix of the first OFDM-based symbol, and to adjust the initial receiver gain based on the measured power.

20. The apparatus of claim 18, wherein the at least one processor is configured to identify at least one transmitter expected to transmit in the first OFDM-based symbol, to determine the initial receiver gain based on a predicted received power level for the at least one transmitter, and to apply the initial receiver gain at start of the first OFDM-based symbol.

21. The apparatus of claim 18, wherein the at least one processor is configured to select the initial receiver gain by cycling through a pattern of different receiver gains, and to apply the initial receiver gain at start of the first OFDM-based symbol.

22. The apparatus of claim 18, wherein the at least one processor is configured to receive a second OFDM-based symbol following the first OFDM-based symbol, the first and second OFDM-based symbols having same set of transmitters, to determine a second receiver gain based on the adjusted receiver gain for the first OFDM-based symbol, and to scale the second OFDM-based symbol based on the second receiver gain.

23. The apparatus of claim 18, wherein the at least one processor is configured to receive a second OFDM-based symbol following the first OFDM-based symbol, the first and second OFDM-based symbols potentially having different sets of transmitters, to scale the second OFDM-based symbol based on a second initial receiver gain; and to adjust the second initial receiver gain based on the cyclic prefix of the second OFDM-based symbol.

24. An apparatus for wireless communication, comprising:
means for receiving a first orthogonal frequency division multiplexing (OFDM)-based symbol comprising a cyclic prefix and a useful portion;
means for scaling the first OFDM-based symbol based on an initial receiver gain; and
means for adjusting the initial receiver gain based on the cyclic prefix of the first OFDM-based symbol.

25. The apparatus of claim 24, wherein the means for adjusting the initial receiver gain comprises
means for measuring power of a set of samples in the cyclic prefix of the first OFDM-based symbol, and
means for adjusting the initial receiver gain based on the measured power.

26. The apparatus of claim 24, further comprising:
means for identifying at least one transmitter expected to transmit in the first OFDM-based symbol;
means for determining the initial receiver gain based on a predicted received power level for the at least one transmitter; and means for applying the initial receiver gain at start of the first OFDM-based symbol.

27. The apparatus of claim 24, further comprising:

means for selecting the initial receiver gain by cycling through a pattern of different receiver gains, and means for applying the initial receiver gain at start of the first OFDM-based symbol.

28. The apparatus of claim 24, further comprising:

means for receiving a second OFDM-based symbol following the first OFDM-based symbol, the first and second OFDM-based symbols having same set of transmitters;

means for determining a second receiver gain based on the adjusted receiver gain for the first OFDM-based symbol; and means for scaling the second OFDM-based symbol based on the second receiver gain.

29. The apparatus of claim 24, further comprising:

means for receiving a second OFDM-based symbol following the first OFDM-based symbol, the first and second OFDM-based symbols potentially having different sets of transmitters;

means for scaling the second OFDM-based symbol based on a second initial receiver gain; and means for adjusting the second initial receiver gain based on the cyclic prefix of the second OFDM-based symbol.

30. A computer program product, comprising:

a computer-readable medium comprising:

code for causing at least one computer to receive an orthogonal frequency division multiplexing (OFDM)-based symbol comprising a cyclic prefix and a useful portion, code for causing the at least one computer to scale the OFDM-based symbol based on an initial receiver gain, and code for causing the at least one computer to adjust the initial receiver gain based on the cyclic prefix of the OFDM-based symbol.

* * * * *